United States Patent [19]
Barth et al.

[11] Patent Number: 6,075,743
[45] Date of Patent: *Jun. 13, 2000

[54] METHOD AND APPARATUS FOR SHARING SENSE AMPLIFIERS BETWEEN MEMORY BANKS

[75] Inventors: Richard M. Barth; Donald C. Stark, both of Palo Alto; Ely K. Tsern, Los Altos, all of Calif.

[73] Assignee: Rambus Inc., Mountain View, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/862,603

[22] Filed: May 23, 1997

Related U.S. Application Data

[60] Provisional application No. 60/033,889, Dec. 26, 1996.

[51] Int. Cl.$^7$ .................................................... G11C 13/00
[52] U.S. Cl. ............................. 365/230.01; 361/230.04; 361/230.06
[58] Field of Search .............................. 365/200, 230.01, 365/230.04, 230.6, 189.01

[56] References Cited

U.S. PATENT DOCUMENTS

| | | | |
|---|---|---|---|
| 4,303,986 | 12/1981 | Lans ..................................... | 365/230.01 |
| 4,933,907 | 6/1990 | Kumanoya et al. . | |
| 4,947,373 | 8/1990 | Yamaguchi et al. ................ | 365/189.04 |
| 5,040,152 | 8/1991 | Voss et al. . | |
| 5,043,947 | 8/1991 | Oshima et al. ...................... | 365/230.03 |
| 5,107,459 | 4/1992 | Chu et al. ................................ | 365/63 |
| 5,267,214 | 11/1993 | Fujishima et al. .................. | 365/230.03 |
| 5,270,975 | 12/1993 | McAdams ........................... | 365/230.06 |
| 5,444,305 | 8/1995 | Matsui ....................................... | 365/207 |
| 5,487,050 | 1/1996 | Kim et al. ........................... | 365/230.06 |
| 5,499,216 | 3/1996 | Yamamoto .......................... | 365/230.04 |
| 5,586,078 | 12/1996 | Takase et al. ....................... | 365/230.03 |
| 5,623,452 | 4/1997 | Lee ...................................... | 365/230.05 |
| 5,657,285 | 8/1997 | Rao ......................................... | 365/203 |
| 5,706,244 | 1/1998 | Shimizu ............................. | 365/230.03 |

FOREIGN PATENT DOCUMENTS

0704847 A1   4/1996   European Pat. Off. .

OTHER PUBLICATIONS

Przybyiski, Steven, Mo Sys Revels MDRAM Architecture, Microprocessor Report pp. 17–20 Dec. 25, 1995.
PCT International Search Report, May 6, 1998, 6 pages.
PCT International Search Report, Oct. 30, 1998, 3 pages.

*Primary Examiner*—Terrell W. Fears
*Attorney, Agent, or Firm*—Blakely, Sokoloff, Taylor & Zafman LLP

[57] ABSTRACT

A memory device includes a first memory bank and a second memory bank, each memory bank having at least one subarray of memory cells. Multiple sense amplifiers are coupled to both the first memory bank and the second memory bank. The multiple sense amplifiers are configured for use by both the first memory bank and the second memory bank, but not simultaneously. A control mechanism is used to avoid accessing the first memory bank and the second memory bank simultaneously. The sharing of sense amplifiers between memory banks minimizes the die area penalty caused by additional memory banks.

20 Claims, 6 Drawing Sheets

FIG_1 (PRIOR ART)

FIG_2

FIG_3

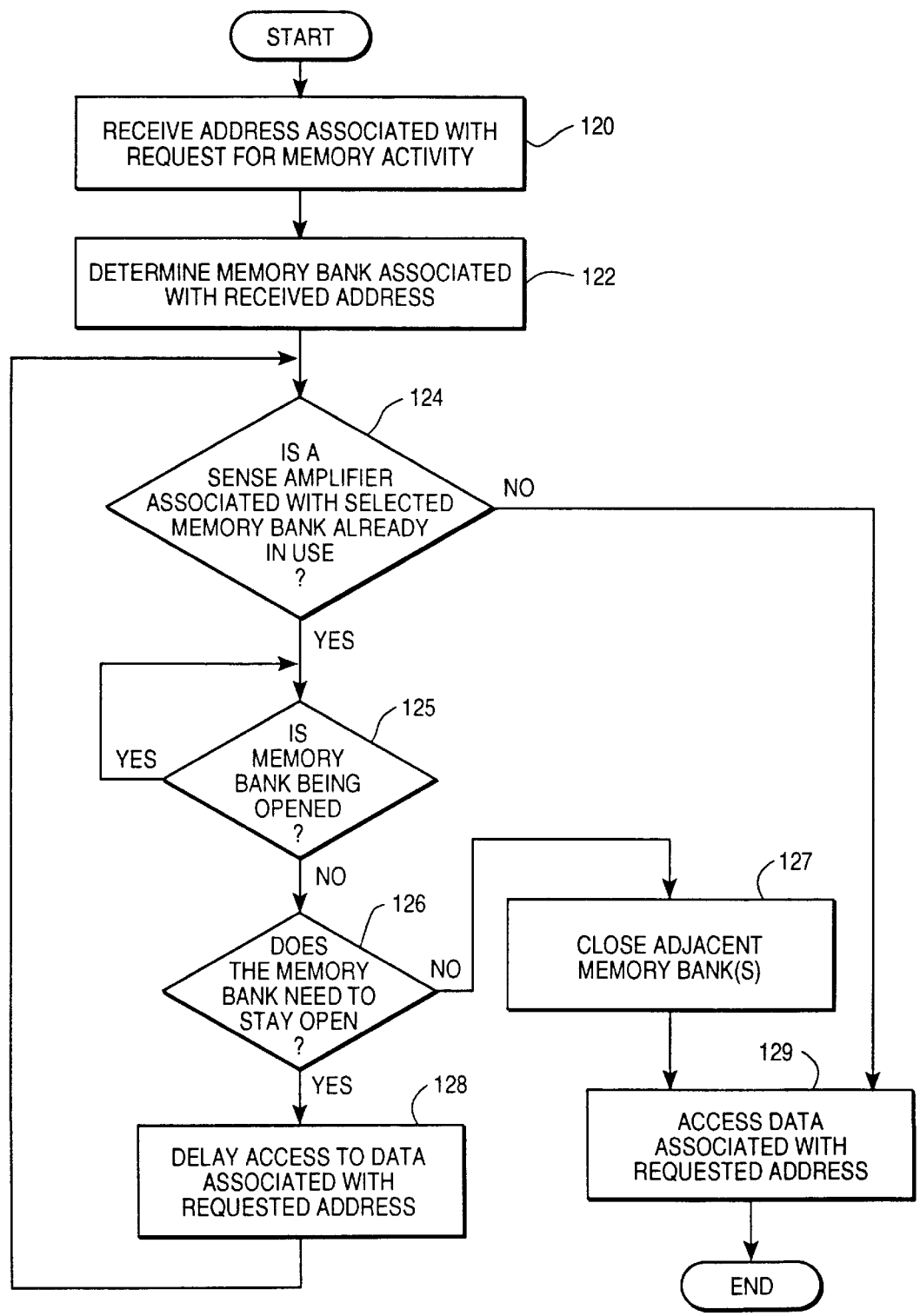
FIG_6

METHOD AND APPARATUS FOR SHARING SENSE AMPLIFIERS BETWEEN MEMORY BANKS

This application claims the benefit of U.S. provisional application Ser. No. 60/033,889 filed on Dec. 26, 1996.

FIELD OF THE INVENTION

The present invention relates to data storage devices. More specifically, the invention provides a system that allows multiple memory banks to share one or more sense amplifiers.

BACKGROUND OF THE INVENTION

A memory device may include one or more memory banks. A memory bank typically includes multiple memory subarrays and multiple sense amplifiers. Additionally, a memory bank includes row decoders and column decoders to decode row and column addresses to access the data stored within the memory subarrays.

To improve memory performance or reduce power, memory devices have been developed that include multiple memory banks in a single device. The use of multiple memory banks in a single memory device increases performance by permitting simultaneous access to two or more different memory banks. An increased number of memory banks means fewer sense amplifiers per bank. This reduction in the number of sense amplifiers in each bank causes fewer sense amplifiers to be activated and fewer bit lines to be charged during a memory access, thereby reducing the power of the device. In existing memory devices, each memory bank is independent; i.e., each memory bank is capable of being operated and accessed separately from the other memory banks.

In any given memory core, the arrangement and orientation of the memory subarrays allows for a wide variety of memory bank organizations. Typically, additional memory banks cost die area. This die area penalty is caused by the additional row decoders and control circuits required to support each memory bank, and by the additional sense amplifier arrays for the memory subarrays to provide fully independent memory bank operation.

Memory core organizations can be classified into two broad categories: conventional organizations in which I/O wires are perpendicular to the bit lines, and hierarchical organizations in which the I/O wires are parallel to the bit lines.

FIG. 1 illustrates a die for a memory device having a conventional core architecture. Die 10 includes four independent memory banks 12, 14, 16, and 18 arranged as shown. Each memory bank 12–18 includes multiple arrays of sense amplifiers 20 shared between multiple memory subarrays 22. Memory subarrays 22 are arranged such that an array of sense amplifiers 20 is located on opposite sides of each memory subarray 22. Sense amplifiers 20 are used to determine the data stored in an adjacent memory subarray 22. Note that no sense amplifiers are shared between memory banks, although sense amplifiers are shared between memory subarrays within a particular memory bank.

To "open" a memory bank refers to the process of retrieving data from the memory cells to the sense amplifiers. Once the data has been retrieved from the memory cells into the sense amplifiers, the memory bank is "opened." To "close" a memory bank, data in the sense amplifiers is rewritten to the memory cells and the sense amplifiers are deactivated.

Each memory bank 12–18 includes row decoder and column control circuits for decoding the row addresses to access the data stored in memory subarrays 22. Additionally, column decoders 21 are located between each memory bank 12–18 and peripheral circuits 23. The row decoder activates a particular word line based on the received address. The column decoder selects one or more sense amplifiers from which data is retrieved based on the received address.

As illustrated in FIG. 1, each memory bank 12–18 is independent of the other memory banks; i.e., each memory bank is capable of being operated and accessed separately from the other memory banks. The arrays of sense amplifiers 20, row decoders, and column decoder circuits are associated with a specific memory bank. Because memory banks 12–18 are independent of one another, all four memory banks 12–18 can be accessed simultaneously.

Die 10 also includes a channel interface and input/output (I/O) pads 24, which are coupled to the pins or leads of the memory device. Additionally, peripheral circuits 23 are located on die 10. Peripheral circuits 23 include the circuits necessary to operate the memory device, such as voltage regulators and mechanisms for routing signals such as addresses, memory bank control signals, row sense signals, and memory bank open and close signals. Die 10 shown in FIG. 1 is provided for purposes of explanation, and is not necessarily drawn to scale.

As the number of memory banks in a memory device increases, the amount of support circuitry required increases and the die size (or die area) increases. In existing memory devices, each memory bank requires separate row decoders and other control circuits to support the memory bank. Additionally, each memory bank requires separate sense amplifiers to provide independent memory bank operation. Existing memory devices that have a small number of memory banks (e.g., 2 or 4 banks) do not require a significant increase in the number of sense amplifiers. However, as the number of memory banks increases (e.g., 8 or 16 banks), the additional area required by sense amplifiers becomes significant and increases die cost.

SUMMARY AND OBJECTS OF THE INVENTION

An objective of the present invention is to provide a mechanism for minimizing the die area required for a memory device having multiple memory banks.

Another objective of the invention is to provide a mechanism for sharing sense amplifiers between multiple memory banks.

An embodiment of the invention provides a memory device including a first memory bank and a second memory bank. The memory device also includes an array of sense amplifiers coupled to both the first memory bank and the second memory bank.

Other embodiments of the invention include a control mechanism configured to prevent access to the first memory bank and the second memory bank simultaneously. This control mechanism may also close an adjacent memory bank automatically to provide access to another memory bank.

Other objects, features, and advantages of the present invention will be apparent from the accompanying drawings and from the detailed description that follows below.

BRIEF DESCRIPTION OF THE DRAWINGS

The present invention is illustrated by way of example in the figures of the accompanying drawings, in which like references indicate similar elements and in which:

FIG. 6 is a flow diagram illustrating an embodiment of a procedure for accessing memory banks having shared sense amplifiers.

DETAILED DESCRIPTION

Embodiments of the present invention provide a memory device that has multiple memory banks that share one or more sense amplifiers. Particular embodiments of the invention provide a mechanism for controlling access to memory banks having shared sense amplifiers. As discussed above, a memory bank typically includes multiple memory subarrays and multiple sense amplifiers. Additionally, a memory bank includes row decoders and column decoders to decode row and column addresses to access the data stored within the memory subarrays.

Although existing memory devices share sense amplifiers between memory subarrays within a particular memory bank, embodiments of the present invention share sense amplifiers between different memory banks. This sharing of sense amplifiers between different memory banks is referred to as a dependent bank organization. By sharing sense amplifiers between memory banks, less die area is required than with conventional systems that do not share sense amplifiers between memory banks. This smaller die area reduces the cost of the memory device. The use of shared sense amplifiers between memory banks also allows more memory banks to be provided in the same die area, thereby increasing memory performance. However, when sharing sense amplifiers between memory banks, it becomes necessary to restrict access to a particular memory bank in certain situations.

An embodiment of the present invention is related to a mechanism that allows multiple memory banks in a memory device to share one or more sense amplifiers. This sharing of sense amplifiers between memory banks reduces the die area of the memory device by reducing the number of sense amplifiers in the device compared to a device with fully independent banks.

Figure 1:
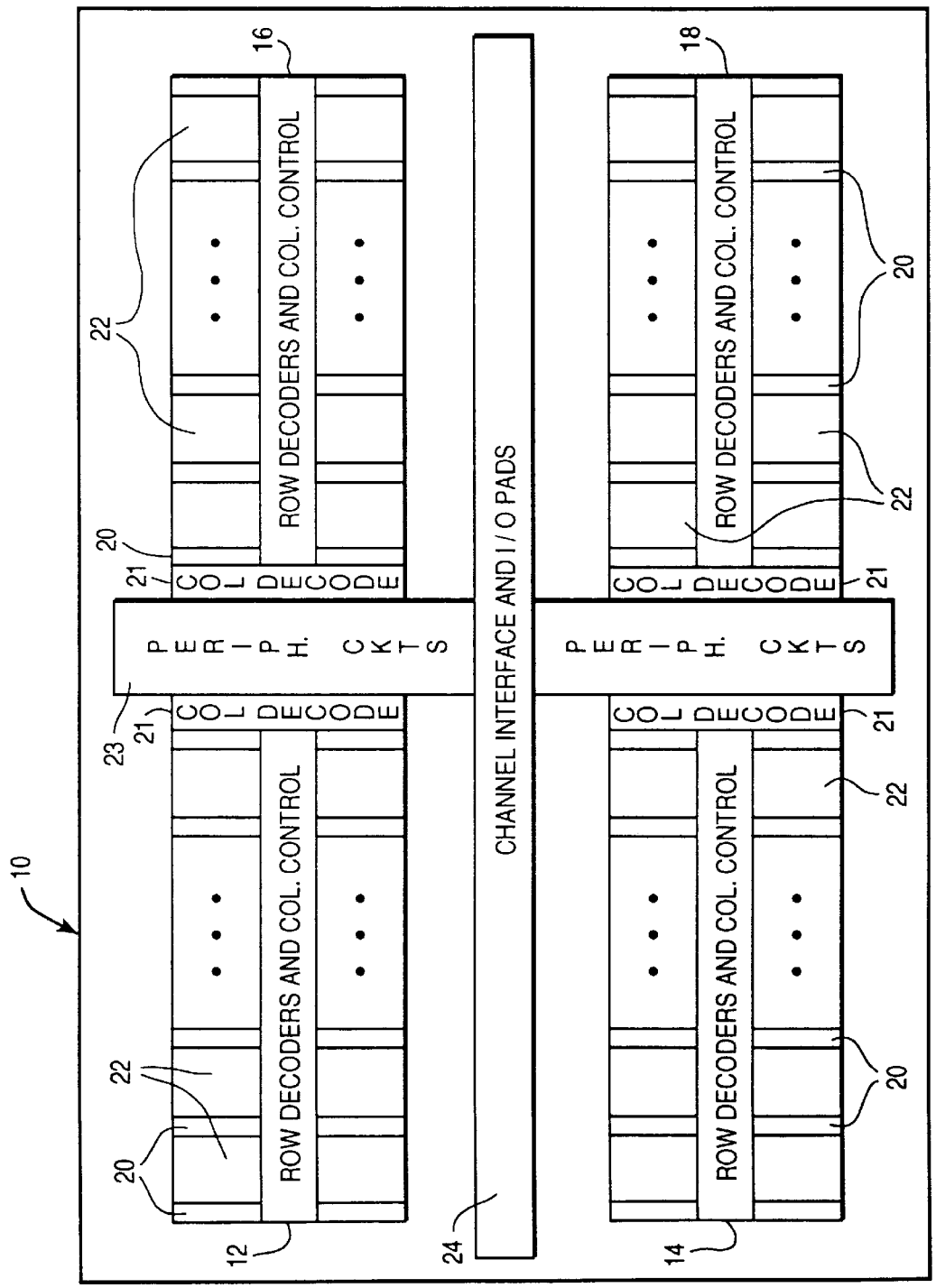
FIG. 1 illustrates a die for a memory device having a conventional core architecture.
Figure 2:
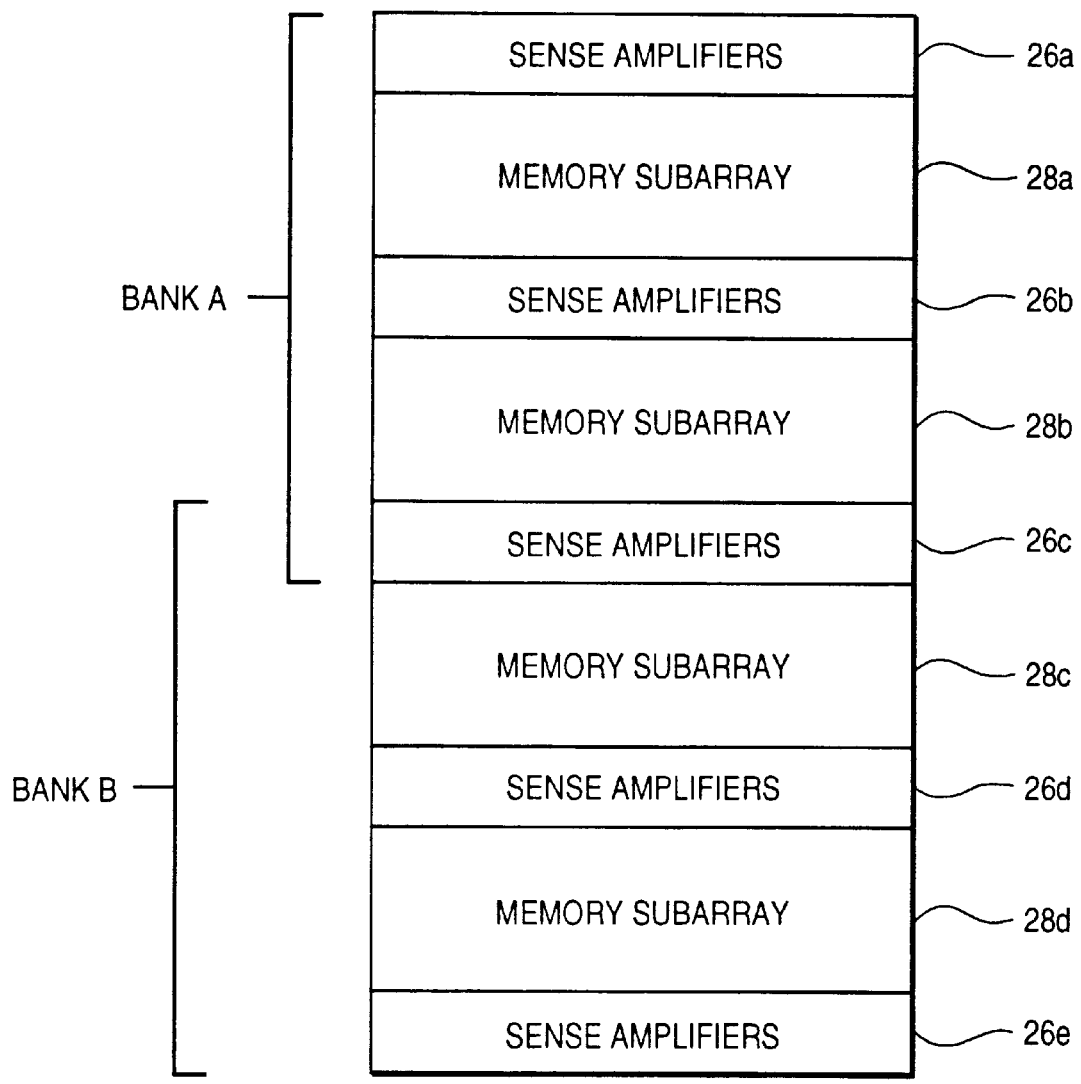
FIG. 2 illustrates an embodiment of a pair of memory subarrays having sense amplifiers on opposite sides of each subarray.

FIG. 2 illustrates an embodiment of a pair of memory subarrays having sense amplifiers on opposite sides of each subarray. Multiple memory subarrays 28a, 28b, 28c, and 28d are arranged with multiple sense amplifier arrays 26a, 26b, 26c, 26d, and 26e, as shown. Memory subarrays 28a and 28b are associated with memory bank A and memory subarrays 28c and 28d are associated with memory bank B. In this arrangement, memory subarray 28b uses sense amplifiers 26b and 26c to access data in the memory subarray. Similarly, memory subarray 28c uses sense amplifiers 26c and 26d to access data in the memory subarray. In this example, sense amplifiers 26c are shared by both memory subarray 28b and memory subarray 28c. Thus, sense amplifiers 26c are shared by memory bank A and memory bank B.

Although a shared sense amplifier (e.g., sense amplifier 26c) is in use by memory bank B, memory bank A can still be accessed (e.g., memory subarray 28a), but not to the subarray with the shared sense amplifier.

Shared sense amplifiers 26c are substantially similar to sense amplifiers 26a, 26b, 26d, and 26e, and occupy substantially the same die area. In one embodiment of the invention, sense amplifiers 26c are identical to sense amplifiers 26a, 26b, 26d, and 26e. Due to the fact that sense amplifiers 26c are shared between memory bank A and memory bank B, die area is reduced from that which would be required if each memory bank had an independent array of sense amplifiers (e.g., two sense amplifier arrays located between memory bank A and memory bank B). This reduction in die area reduces the overall size of the die for a particular memory capacity.

Figure 3:
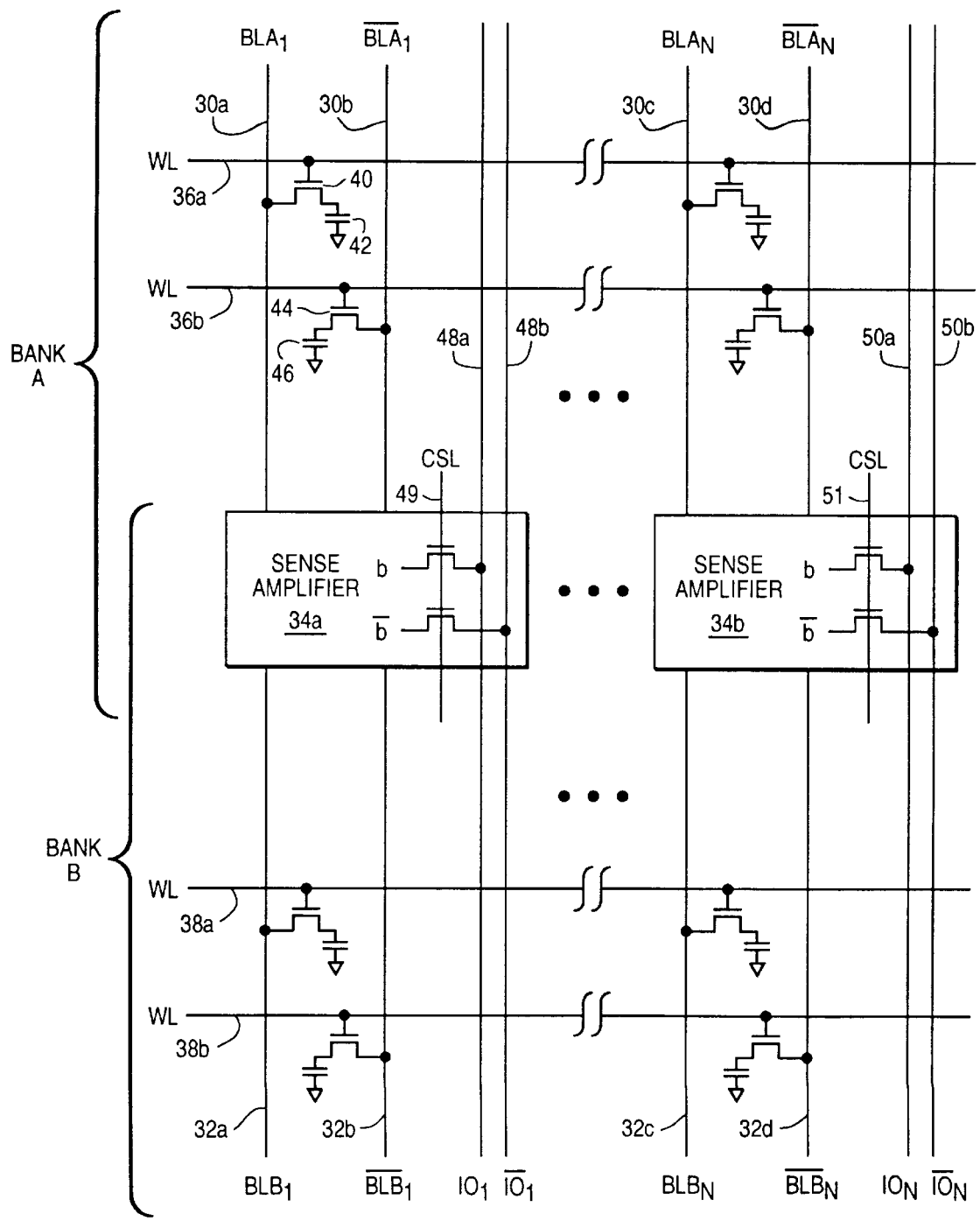
FIG. 3 is a detailed illustration of a portion of a memory device having adjacent memory banks.

FIG. 3 is a detailed illustration of a portion of a memory device having adjacent memory banks (identified as Bank A and Bank B). A pair of bit lines 30a and 30b are coupled to a sense amplifier 34a. Another pair of bit lines 30c and 30d are coupled to a sense amplifier 34b. Bit lines 30a, 30b, 30c, and 30d are associated with a memory subarray in a first memory bank (e.g., memory bank A in FIG. 2). Bit lines 32a and 32b are coupled to sense amplifier 34a, and bit lines 32c and 32d are coupled to sense amplifier 34b. Bit lines 32a, 32b, 32c, and 32d are associated with a memory subarray in a second memory bank (e.g., memory bank B in FIG. 2). Although bit lines 30a–30d and 32a–32d are coupled to and share the same sense amplifiers 34a and 34b, only one set of bit lines can be accessed at a particular time.

Word lines 36a and 36b are positioned perpendicular to bit lines 30a–30d. Similarly, word lines 38a and 38b are positioned perpendicular to bit lines 32a–32d. Each memory subarray is divided into multiple cells, in which each cell stores a single bit of information. For example, capacitors 42 and 46 each store a single bit of information. Each capacitor in a memory subarray is coupled to a gate, such as a transistor, which allows data to be stored in or retrieved from the capacitor.

For example, when word line 36a is activated, a transistor 40 is also activated such that a charge stored in capacitor 42 is transferred to bit line 30a. Sense amplifier 34a identifies the charges on the two bit lines 30a and 30b. Based on the charge values on each bit line 30a and 30b, sense amplifier 34a determines the value stored in the cell (i.e., the charge stored in capacitor 42). A similar operation may be used to activate a transistor 44 to store data in or retrieve data from capacitor 46. Thus, the data stored in any particular cell is determined by activating the word line associated with the desired data, and identifying the charges on a pair of bit lines associated with the desired data.

After the data has been identified by the sense amplifier, the data is transmitted from the sense amplifier across I/O wires 48a and 48b. I/O wires 48a and 48b may be coupled to multiple arrays of sense amplifiers and are capable of transmitting data to and from any of the sense amplifiers coupled to the I/O wires. A column select line (CSL) is activated to cause a particular sense amplifier to read data from or write data to the I/O wires. For example, CSL 49 activates sense amplifier 34a to read from or write to I/O wires 48a and 48b. Similarly, CSL 51 activates sense amplifier 34b to read from or write to I/O wires 50a and 50b.

It will be appreciated by those of ordinary skill in the art that FIG. 3 illustrates a small portion of a memory device. An actual device may contain hundreds or thousands of bit lines and word lines, and numerous associated capacitors, transistors, and sense amplifiers. Additionally, the direction of the I/O lines and CSL lines in FIG. 3 with respect to the direction of the bit lines and word lines is illustrative. It will be appreciated that other arrangements of the I/O lines, CSL lines, bit lines, and word lines are possible within the scope of the invention. As discussed above, memory core organizations can be classified into two broad categories: conventional organizations in which I/O wires are perpendicular to the bit lines, and hierarchical organizations in which the I/O wires are parallel to the bit lines. Particularly in hierarchical organizations, the arrangement of the memory subarrays and sense amplifiers allows for memory bank organizations that can share sense amplifiers between memory banks. This can lead to significant die area savings, which is particularly important as the requirement for the number of memory banks per memory device increases in higher performance systems.

Figure 4:
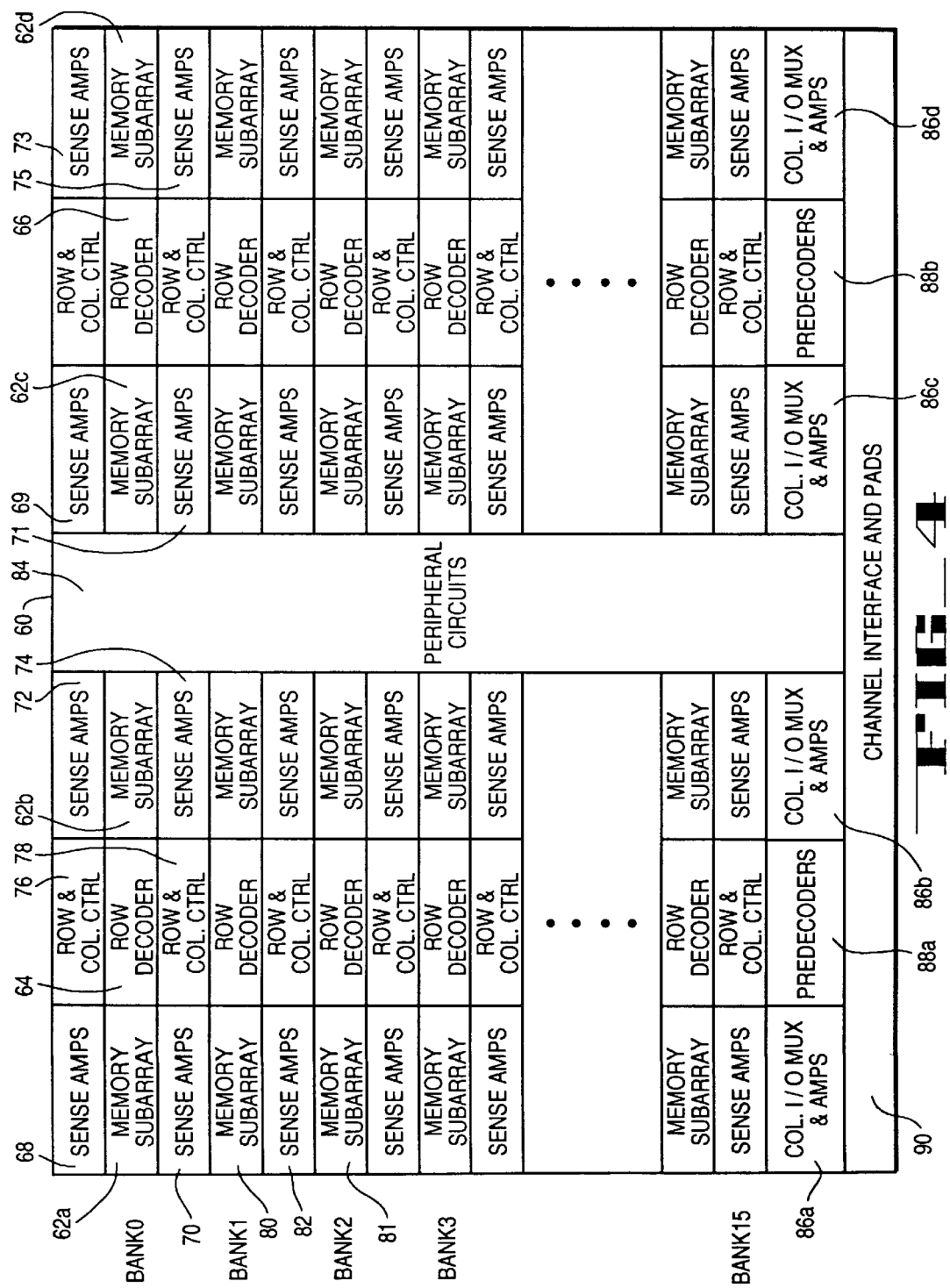
FIG. 4 illustrates an embodiment of a die for a memory device using shared sense amplifiers between multiple memory banks.

FIG. 4 illustrates an embodiment of a die for a memory device using shared sense amplifiers positioned between adjacent memory banks. Die 60 includes 16 memory banks, labeled bank 0–bank 15. Each memory bank includes four memory subarrays arranged horizontally, as shown in FIG. 4. For example, memory bank 0 includes memory subarrays 62a, 62b, 62c, and 62d. Each memory subarray has an array of sense amplifiers located on opposite sides of the subarray. For example, memory subarray 62a has sense amplifiers 68 and 70 located on opposite sides of the subarray. Similarly, memory subarray 62b has sense amplifiers 72 and 74 located on opposite sides.

In this example, row decoders are positioned between the first and second memory subarrays as well as the third and fourth memory subarrays. For example, in memory bank 0, row decoder 64 is positioned between memory subarrays 62a and 62b. Similarly, row decoder 66 is positioned between memory subarrays 62c and 62d. The row decoders are used to select the data stored in the adjacent memory subarrays.

In the embodiment of FIG. 4, row and column control circuits are located between the first and second sense amplifiers and the third and fourth sense amplifiers. For example, row and column control circuit 76 is located between sense amplifier arrays 68 and 72.

FIG. 4 also illustrates column I/O multiplexers and amplifiers located adjacent to memory bank 15. For example, column I/O multiplexers and amplifiers 86a, 86b, 86c, and 86d are used to control access to the various memory subarrays in die 60. Predecoders 88a and 88b are used in conjunction with the row decoders and other control circuits to access the information stored within the memory subarrays. Peripheral circuits 84 include the various components and circuits necessary for the die to operate properly. Channel interface and pads 90 are used to couple the information contained in the various memory subarrays to the external pins or connections of the memory device that contains die 60.

As shown in FIG. 4, the memory subarrays of adjacent memory banks share sense amplifiers located between the memory subarrays. For example, sense amplifiers 70 are located between memory subarray 62a (bank 0) and memory subarray 80 (bank 1). Thus, rather than providing two separate sense amplifiers between memory bank 0 and memory bank 1 (one sense amplifier for memory subarray 62a and another sense amplifier for memory subarray 80), a single array of sense amplifiers 70 is shared by the two memory subarrays 62a and 80. Similarly, sense amplifiers 82 located between memory subarray 80 (bank 1) and memory subarray 81 (bank 2) are shared by the two memory subarrays 80 and 81. This sharing of sense amplifiers by adjacent memory banks is repeated throughout die 60.

Due to the fact that the sense amplifiers shown in FIG. 4 are shared between adjacent memory banks, only one of the adjacent memory banks may be accessed at a particular time. For example, if memory bank 0 is being accessed, then the sense amplifiers associated with memory subarrays 62a–62d are being used (i.e., sense amplifiers 68–75). In this situation, memory bank 1 shares sense amplifiers 70, 71, 74 and 75 being used by memory bank 0. Therefore, memory bank 1 cannot be accessed when memory bank 0 is being accessed. Similarly, if memory bank 1 is being accessed, then neither memory bank 0 nor memory bank 2 can be accessed due to the shared sense amplifier arrays on both sides of memory bank 1. However, memory banks 3–15 are not affected by the accessing of memory bank 1. Thus, when a particular memory bank is accessed, adjacent memory banks that share sense amplifier arrays cannot be accessed, but those memory banks that do not share sense amplifiers may be accessed.

The memory core configuration illustrated in FIG. 4 represents one configuration capable of implementing the teachings of the present invention. In alternate embodiments, various other core configurations may be used to practice the present invention. Alternative configurations may include any number of memory banks of various sizes and containing any number of memory subarrays. For example, each memory subarray illustrated in FIG. 4 can be treated as a separate memory bank. In this embodiment, the die illustrated in FIG. 4 has 64 memory banks (16 rows of memory subarrays multiplied by 4 columns of memory subarrays).

To minimize die size for devices with many memory banks, supporting circuits can be shared (along with the sense amplifiers) between memory banks. These supporting circuits that can be shared include row decoders, column decoders, row control circuits, and column control circuits. An example of this sharing of supporting circuits will be discussed using the example in which each memory subarray in FIG. 4 is treated as a separate memory bank. The output of row decoder 64 can be routed to multiple memory banks 62a and 62b. In this situation, separate control logic provides control signals that select the particular memory bank to which the row decoder output is provided. Similarly, the outputs of the row and column control circuits 76 can be routed to multiple sense amplifiers 68 and 72. Separate control logic provides control signals that select the particular sense amplifier to which the output of the row and column control circuit is provided.

In another embodiment of the invention, subpage sensing is used to increase the number of memory banks. For example, each memory subarray shown in FIG. 4 is divided into multiple sections using subword lines. Additionally, the sense amplifiers are divided into the same multiple sections to provide subpage sensing. In this embodiment, the first sections of the memory subarrays in a particular row form a single memory bank. Similarly, the second sections of the memory subarrays in a particular row form another memory bank. It will be appreciated that various other memory configurations may be used to implement the sharing of sense amplifiers between memory banks.

Figure 5:
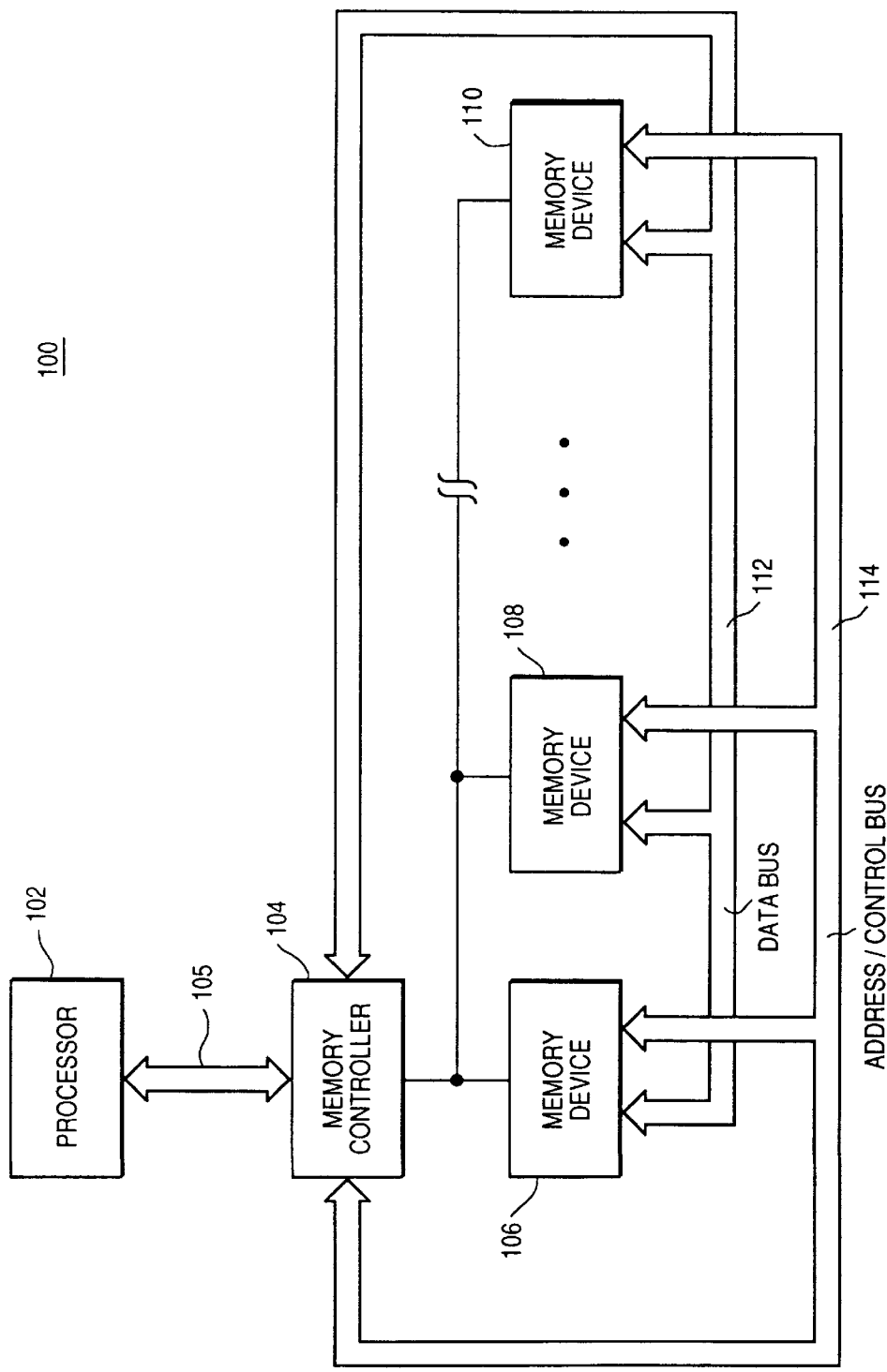
FIG. 5 illustrates an embodiment of a processor-based system including a memory controller and multiple memory devices.

FIG. 5 illustrates an embodiment of a processor-based system including a memory controller and multiple memory devices. System 100 includes a processor 102 coupled to a memory controller 104 using a communication link 105.

Memory controller 104 is coupled to multiple memory devices 106, 108, and 110. A data bus 112 is coupled to memory devices 106–110 and memory controller 104. An address/control bus 114 is coupled to memory devices 106–110 and memory controller 104. Memory controller 104 contains information regarding the configuration of memory devices 106–110 such that the memory controller prevents simultaneous access to adjacent memory banks that share one or more sense amplifiers. The configuration illustrated in FIG. 5 is provided as an example of a system using a memory controller to control the access to multiple memory devices. In alternative embodiments of the invention, various other configurations may be used to control one or more memory devices. For example, the processor can directly control the memory devices.

FIG. 6 is a flow diagram illustrating an embodiment of a procedure for accessing memory banks having shared sense amplifiers. The procedure illustrated in FIG. 6 may be implemented by a memory controller or similar device. At step 120, an address is received, which is associated with a particular request for memory activity (e.g., a memory read or a memory write). Step 122 determines the particular memory bank that is associated with the received address. Step 124 then determines whether a sense amplifier associated with the selected memory bank is already in use (e.g., in use by an adjacent memory bank). If all sense amplifiers associated with the selected memory bank are available for use, then the procedure branches to step 129 where the data associated with the requested address is accessed.

If step 124 determines that one or more sense amplifiers associated with the selected memory bank are already in use, then the procedure continues to step 125 to determine whether any of the adjacent memory banks are currently being opened. If one or more memory banks are in the process of being opened, the procedure branches back to step 125 to wait for the opening procedure to complete. If the adjacent memory banks are already open, then the procedure continues from step 125 to step 126.

Step 126 determines whether any of the adjacent memory banks need to stay open (e.g., if an application is currently accessing data from the memory bank, the memory bank should remain open). If step 126 determines that the memory bank does not need to remain open, then the procedure branches to step 127, where one or more adjacent memory banks are closed. Various systems are available for closing one or more adjacent memory banks. For example, memory control circuitry (located within the memory device or in an external device) may automatically close particular memory banks if access is requested to another memory bank that shares one or more common sense amplifiers. Alternatively, control mechanisms in the memory device may be provided to automatically close a particular memory bank after a memory access operation is completed. After closing one or more adjacent memory banks, the procedure continues from step 127 to step 129 to access data associated with the requested address.

If step 126 of FIG. 6 determines that one or more adjacent memory banks need to remain open, then the procedure branches to step 128 to delay access to the data associated with the requested address. The procedure then returns to step 124 to determine whether the sense amplifiers associated with the selected memory bank are available for use. The sense amplifiers may become available for use because the memory access operation in the adjacent memory bank is completed, or a memory control circuit closed the adjacent memory bank. The procedure for accessing memory banks described above with reference to FIG. 6 may be implemented by control circuits within the memory device or by a separate memory controller device. Alternatively, the procedure of FIG. 6 may be implemented by a combination of control circuits within the memory device and an external memory controller.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A memory device comprising:
   a first memory bank including at least one subarray of memory cells;
   a second memory bank including at least one subarray of memory cells;
   a plurality of sense amplifiers, wherein each sense amplifier is coupled to at least one subarray of memory cells, and wherein at least one sense amplifier is coupled to a memory subarray in the first memory bank and a memory subarray in the second memory bank; and
   a control mechanism configured to avoid simultaneous access to memory subarrays that share a common sense amplifier.

2. The memory device of claim 1 wherein the control mechanism is configured to avoid simultaneous access to the first memory bank and the second memory bank.

3. The memory device of claim 1 wherein the memory device includes a plurality of memory banks and a plurality of sense amplifier arrays located between adjacent memory banks.

4. The memory device of claim 1 wherein the memory device implements subpage sensing to identify memory banks.

5. The memory device of claim 1 wherein the control mechanism is configured to close any open memory banks that are adjacent to a memory bank being accessed.

6. The memory device of claim 1 wherein the control mechanism is configured to close all memory banks adjacent to a particular memory bank being accessed.

7. The memory device of claim 1 wherein the control mechanism automatically closes the second memory bank when a close operation is performed on the first memory bank and the second memory bank is open.

8. A data storage system comprising:
   a memory controller;
   at least one memory device coupled to the memory controller, wherein the memory device includes:
   a first memory bank including at least one subarray of memory cells;
   a second memory bank including at least one subarray of memory cells; and
   an array of sense amplifiers coupled to the first memory bank and the second memory bank.

9. The data storage system of claim 8 wherein the array of sense amplifiers in a particular memory device is configured to be used by both the first memory bank and the second memory bank in the particular memory device.

10. The data storage system of claim 8 wherein the memory controller is configured to prevent simultaneous access to memory subarrays that share a common sense amplifier.

11. The data storage system of claim 8 wherein each memory device implements subpage sensing to identify memory banks.

12. The data storage system of claim 8 wherein the memory controller is configured to close any open memory banks in a particular memory device that are adjacent to a memory bank being accessed in the particular memory device.

13. The data storage system of claim 8 wherein the memory controller is configured to close all memory banks in a particular memory device that are adjacent to a memory bank being accessed in the particular memory device.

14. The data storage system of claim 8 wherein the memory device further includes at least one supporting circuit that controls access to memory banks in the memory device, and wherein the supporting circuit is shared between multiple memory banks in the memory device.

15. The data storage system of claim 14 further including control logic configured to operatively couple the supporting circuit to an appropriate memory bank in the memory device.

16. A memory device comprising:
    a first memory bank including at least one subarray of memory cells;
    a second memory bank including at least one subarray of memory cells;
    a plurality of sense amplifiers, wherein each sense amplifier is coupled to at least one subarray of memory cells, and wherein at least one sense amplifier is coupled to a memory subarray in the first memory bank and a memory subarray in the second memory bank; and
    at least one supporting circuit that controls access to memory banks in the memory device, wherein the supporting circuit is shared between multiple memory banks in the memory device.

17. The memory device of claim 16 further including control logic configured to operatively couple the supporting circuit to an appropriate memory bank in the memory device.

18. A method for accessing data stored in a memory device, wherein the memory device includes at least two memory banks that share at least one sense amplifier, the method comprising:
    (a) receiving a request to access a particular address;
    (b) determining a memory bank associated with the requested address;
    (c) determining whether a sense amplifier coupled between the at least two memory banks and associated with the memory bank determined in step (b) is already in use; and
    (d) accessing the data associated with the requested address if sense amplifiers associated with the memory bank determined in step (b) are not already in use.

19. The method of claim 18 further including delaying access to the data associated with the requested address if a shared sense amplifier associated with the memory bank determined in step (b) is already in use.

20. The method of claim 18 further including delaying access to the data associated with the requested address if an adjacent memory bank is being opened.

* * * * *